US007867627B2

(12) United States Patent
Smith et al.

(10) Patent No.: US 7,867,627 B2
(45) Date of Patent: Jan. 11, 2011

(54) PROCESS FOR THE MODIFICATION OF SUBSTRATE SURFACES THROUGH THE DEPOSITION OF AMORPHOUS SILICON LAYERS FOLLOWED BY SURFACE FUNCTIONALIZATION WITH ORGANIC MOLECULES AND FUNCTIONALIZED STRUCTURES

(75) Inventors: David A. Smith, Bellefonte, PA (US); Gary A. Barone, State College, PA (US); Martin E. Higgins, State College, PA (US)

(73) Assignee: Silcotek Corporation, Bellefonte, PA (US)

( * ) Notice: Subject to any disclaimer, the term of this patent is extended or adjusted under 35 U.S.C. 154(b) by 1331 days.

(21) Appl. No.: 11/302,309

(22) Filed: Dec. 13, 2005

(65) Prior Publication Data

US 2009/0029178 A1    Jan. 29, 2009

Related U.S. Application Data

(60) Provisional application No. 60/635,733, filed on Dec. 13, 2004.

(51) Int. Cl.
*B32B 15/01* (2006.01)

(52) U.S. Cl. .......... 428/641; 428/428; 428/429; 428/446; 428/450; 428/451; 428/621; 428/622; 428/623

(58) Field of Classification Search .......... 428/428, 428/429, 446, 447, 450, 451, 621, 622, 623, 428/641
See application file for complete search history.

(56) References Cited

U.S. PATENT DOCUMENTS

| 4,579,752 | A | 4/1986 | Dubois et al. | 427/255.18 |
|---|---|---|---|---|
| 4,783,374 | A | 11/1988 | Custer et al. | 428/447 |
| 5,308,707 | A | 5/1994 | Cellier et al. | 428/610 |
| 5,562,952 | A | 10/1996 | Nakahigashi et al. | 427/534 |
| 5,761,158 | A | 6/1998 | Azuma et al. | 368/205 |
| 6,444,326 | B1 | 9/2002 | Smith | 428/448 |
| 6,511,760 | B1 | 1/2003 | Barone et al. | 428/641 |
| 7,070,833 | B2 | 7/2006 | Smith et al. | 427/255.23 |
| 2004/0175579 | A1 | 9/2004 | Smith et al. | 428/446 |

*Primary Examiner*—D. S Nakarani
(74) *Attorney, Agent, or Firm*—John F. A. Earley, III; Frank J. Bonini, Jr.; Harding, Earley, Follmer & Frailey, P.C.

(57) ABSTRACT

Functionalized substrates and method of passivating the surface of a substrate to improve the surface by imparting desirable surface properties to improve the performance of a surface, the method steps including exposing the substrate to a chemical vapor deposition process to coat the substrate with silicon, and functionalizing the coated surface by exposing the substrate surface to a binding reagent having at least one unsaturated hydrocarbon group.

8 Claims, 1 Drawing Sheet

R = H, hydrocarbon, hydrocarbons, substituted hydrocarbons, carbonyls, carboxyls, esters, amines, amides, sulfonic acids, and epoxides

PROCESS FOR THE MODIFICATION OF SUBSTRATE SURFACES THROUGH THE DEPOSITION OF AMORPHOUS SILICON LAYERS FOLLOWED BY SURFACE FUNCTIONALIZATION WITH ORGANIC MOLECULES AND FUNCTIONALIZED STRUCTURES

The benefit under 35 U.S.C. §119(e) of U.S. Provisional Patent Application Ser. No. 60/635,733 filed on Dec. 13, 2004 is hereby claimed.

BACKGROUND OF THE INVENTION

1. Field of Invention

The present invention relates to functionalizing the surface of a substrate to impart desirable properties to the surface, and functionalized structures.

2. Brief Description of the Related Art

The current invention has been developed to improve upon inherent deficiencies in the performance of a variety of substrate surfaces. Examples of such deficiencies include but are not limited to:

a) chemisorption of other molecules,
b) reversible and irreversible physisorption of other molecules
c) catalytic activity with other molecules
d) allow attack from foreign species, resulting in a molecular, structural and/or cosmetic breakdown of the substrate surfaces and/or bulk
e) Outgassing of volatile materials (i.e. water vapor and organics) from a substrate under vacuum environments resulting in extensive time required to reach a target vacuum and/or the inability to achieve a target vacuum and/or the inability to maintain a target vacuum
f) buildup of secondary electron emission on a substrate under vacuum environments
g) hydrogen permeation of a substrate under vacuum environments through coating on the inside and/or outside whereas the inner portion is subjected to vacuum.
h) or any combination of (a)-(g)

There are several known processes that attempt to address the listed deficiencies via a variety of surface treatments. However, a need exists for a process which permits further enhancement of a surface.

There are existing processes which already attempt to alter the surface properties of substrates by: a) depositing multiple layers of amorphous silicon and b) functionalization of a deposited amorphous silicon layer. The purpose of multiple layer amorphous silicon coatings is to protect the treated substrate from corrosive attack and/or to decrease outgassing from the surface under vacuum conditions. A multilayer silicon surface alone, however, may have inadequate inertness and functionality characteristics. By chemically altering the surface through the direct bonding of organic molecules, the surface characteristics can be dramatically altered/improved/tailored to achieve specific surface performance enhancements. Prior art has demonstrated this ability via single-layer silicon depositions followed by surface functionalization; however, this treatment may have insufficient anti-corrosion and/or anti-outgassing performance. By applying a multi-layer deposition in conjunction with a chemically tailored composition of the terminal silicon layer, the surface of a substrate may be optimally enhanced to a desired level of performance.

The prior art shows the use of silanes or silicon hydrides to modify surfaces. The present invention utilizes the formation of a hydrogenated amorphous silicon coating on a surface through the decomposition of silanes or silicon hydrides, followed by a secondary process of surface functionalization with a reagent containing at least one unsaturated hydrocarbon group (e.g., $-CH=CH_2$ or $-C\equiv CH$). Additional elimination of residual surface defects can be achieved through reagents capable of thermal or chemical disproportionation followed by chemical bonding to these sites, and/or radical quenching.

SUMMARY OF THE INVENTION

The present invention provides a unique chemical vapor deposition process through which a substrate is coated with amorphous silicon followed by surface functionalization to impart such desirable properties as chemical inertness, prevention from corrosive attack, prevention from outgassing under vacuum environments, prevention from coke accumulation and the rapid desorption of water from substrate surfaces. The use of single-to-multiple deposition layers with intermediate changes in process temperature, pressures and times has been found to impart coatings that provide enhanced properties that include, but are not limited to, improved chemical resistivity, improved chemical inertness, low chemical activity and low chemical absorptivity. Further enhancement of these desirable properties can be achieved by a surface functionalization that allows a tailorability of the substrate's bulk properties. Therefore, by combining a deposition of one or more layers of amorphous silicon followed by a final amorphous silicon deposition with surface functionalization, optimal properties of resistivity, inertness, activity and absorptivity can be achieved.

The present invention provides functionalized structures, which may be further functionalized to impart a desirable surface property.

Substrates may be comprised of (but are not limited to) metals (ferrous and non-ferrous), glass, carbon, quartz, nickel containing ferrous alloys, titanium, titanium alloys, aluminum, aluminum alloys and ceramics.

DETAILED DESCRIPTION OF THE PREFERRED EMBODIMENTS

Figure 1:
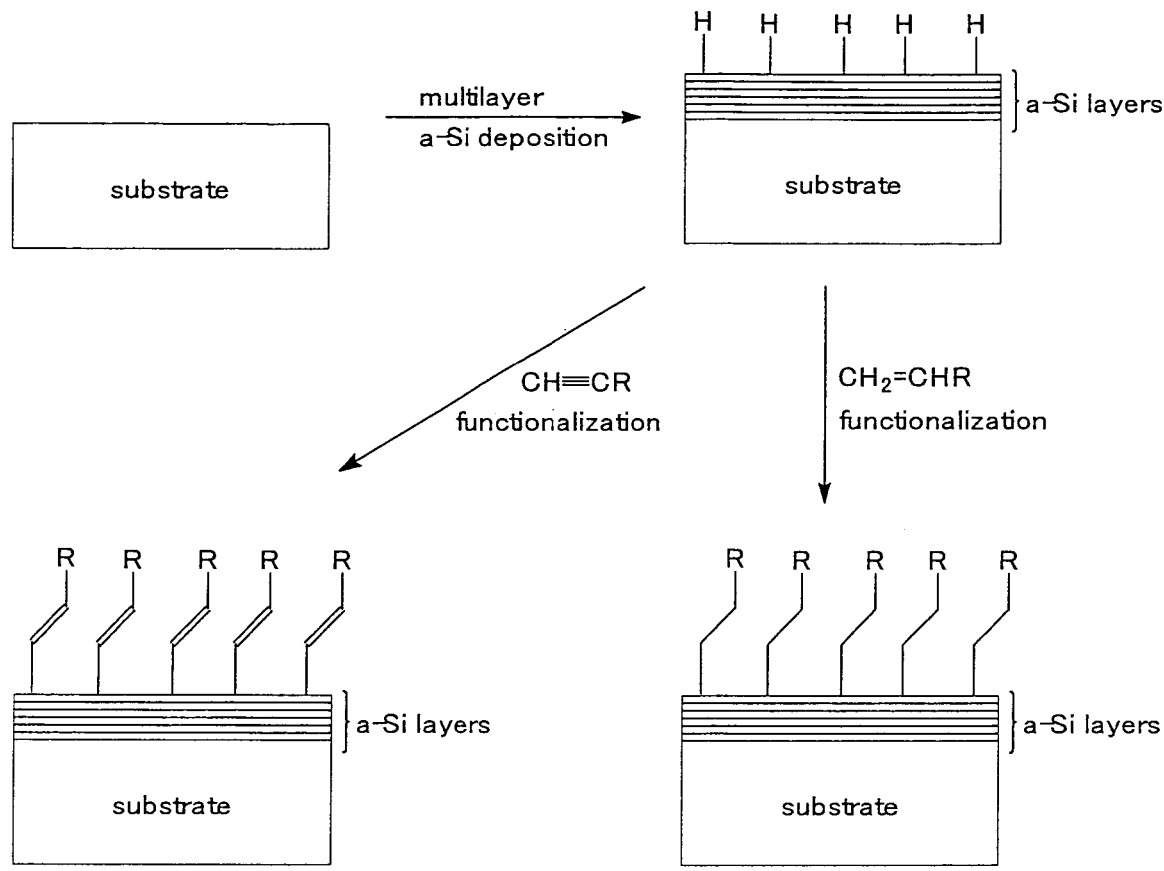
FIG. 1 is a schematic diagram illustrating the process of the present invention.

The present invention provides a method of passivating the surface of a substrate to protect against corrosion, alter the surface chemisorption, physisorption, and/or electronic properties, and/or to improve the performance of a surface within a vacuum environment. The invention provides a chemical vapor deposition process through which a substrate is coated with silicon followed by a final surface functionalization to impart improved properties for application in environments exposed to corrosive, chemical and/or vacuum environments. The use of single to multiple deposition layers with intermediate changes in process temperature, pressures and time, followed by a functionalization step involving the covalent bonding of molecules containing the unsaturated moiety of $-CH=CH_2$ and/or $-C\equiv CH$ has been found to impart coatings that provide enhanced properties to the substrate being treated that include, but are not limited to, application in corrosive environments for improved resistivity, application in chemical environments for enhanced surface activity, being less or more depending upon desired properties, and application in vacuum environments to reduce outgassing, and hydrogen permeation of substrates. The substrate may have enhanced properties for vacuum environments, such as, for example, low ($10^5$ to $3.3\times10^3$ Pa), medium ($3.3\times10^3$ to $10^{-1}$ Pa), high ($10^{-1}$ to $10^{-4}$ Pa), very high ($10^{-4}$ to $10^{-7}$ Pa), ultrahigh ($10^{-7}$ to $10^{-10}$ Pa), and extreme ultrahigh (less than $10^{-10}$ Pa).

The substrate surface which may be coated can include an interior surface, as well as, or alternately, any other substrate surfaces. The present invention also provides substrates having contact surfaces which have been passivated in accordance with the method of the present invention to impart properties for improved resistance to corrosion and reduce the release of surface-bound molecules subjected to a vacuum or gas-flow environment.

In the method of the present invention, a substrate is placed in an environment, such as, for example, a treatment chamber, which may be controlled to carry out the steps of the method. The method may be carried out using the substrate itself or with the substrate housed in a treatment chamber. In the method of the present invention, the surface of a substrate is initially preconditioned by dehydrating the substrate surface. In the dehydration step, the substrate is heated to a temperature in a preferred range of from about 20° C. to 600° C. for a preferred duration of from about 10 to 240 minutes. The substrate is preferably heated in an inert gas or in a vacuum.

After the surfaces of the substrate have been dehydrated, the environment surrounding the substrate surface or treatment chamber is evacuated. A silicon hydride gas is introduced into the environment surrounding the substrate surface or treatment chamber. The substrate and gas contained therein are heated and pressurized to decompose the silicon hydride gas in the treatment chamber. The heating of the silicon hydride gas may be done prior to, during or after the introduction of the gas into the treatment chamber. Preferably, the treatment chamber may be heated and then followed by the introduction of the silicon hydride gas. As the gas decomposes, a layer of silicon is deposited on the surface of the substrate.

The duration of the silicon deposition step and the pressure of the gas are controlled to impart a deposition layer of desired thickness yet prevent the formation of silicon dust in the substrate or treatment chamber. At the end of the silicon deposition step, the substrate environment or treatment chamber is cooled and held at a temperature for a period of time, and is purged with an inert gas to remove the silicon hydride gas. The purging may take place prior to, after or while the substrate is cooling. Preferably, the purging is done as the substrate is being cooled. If the silicon layer completely covers the surface of the substrate, the substrate is then evacuated and cooled to room temperature. If the silicon layer does not adequately coat the substrate surface, the silicon deposition step is repeated until the substrate surface is sufficiently passivated.

In the method of the present invention, the silicon hydride gas is preferably selected from the group comprising $SiH_4$ and $Si_nH_{n+2}$. The silicon hydride gas is heated to a temperature approximately equal to the gas's decomposition temperature, preferably to a temperature in the range of from about 300° C. to 600° C. Preferably, the silicon hydride gas is pressurized to a pressure in a preferred range of from about $1\times10^{-7}$ Torr to 2500 Torr, and in a particularly preferred range of from about 100 Torr to 250 Torr.

In the presence of heat, the silicon hydride gas thermally dissociates to form silane radicals which recombine and bind to the substrate surface. The resultant coating is hydrogenated amorphous silicon which has Si—Si, Si—H, and Si. (radical) moieties on the surface and in the bulk.

After the final hydrogenated amorphous silicon deposition process is complete, the system is purged with an inert gas to remove silane moieties not bound to the substrate surface. After the inert gas purge, the vessel is evacuated. A binding reagent is then introduced into the vessel under elevated temperature and pressure. With heat as a driving force, the reagent reacts with and binds to the hydrogenated amorphous silicon surface via silicon hydride moieties.

The reagent used determines the physical properties displayed by the newly functionalized surface. Surface properties of the substrate can be tailored for a wide variety of functions depending on the reagent used in the process. The binding reagent must have at least one unsaturated hydrocarbon group (i.e., —CH=CH2 or —C≡CH). The reagent may be further comprised of hydrocarbons, substituted hydrocarbons, carbonyls, carboxyls, esters, amines, amides, sulfonic acids, and epoxides.

A preferred binding reagent is ethylene. The binding reagent is introduced into the vessel at a pressure range of about $1\times10^{-7}$ Torr to 2500 Torr. The binding reagent is preferably introduced into the vessel at a temperature less than about 350° C. For example, in one embodiment, the binding reagent is introduced into the vessel at less than about 150° C. and about 1300 Torr.

After the binding reagent is introduced into the vessel, the temperature of the reagent is raised to about 200° to about 500° C., better yet up to about 250° to about 500° C. Preferably, the increased reaction pressure is less than about 2500 Torr, and more preferably less than about 1300 Torr. For example, in one embodiment, the reaction temperature is about 360° C. The reaction time may vary from about 30 minutes to about 24 hours, but typically lasts about 4 hours.

The presence of oxygen mixed at low levels (0-5%) with ethylene, or an oxygenation step (100% oxygen or mixtures of oxygen in other gases) prior to hydrosilylating the substrate, has also shown to assist the deactivation qualities of the hydrogenated amorphous silicon surface. If the process employs an oxygen/ethylene gas mixture, a typical ratio is 2.5% zero air (a nitrogen/oxygen mix) in ethylene.

The present invention also provides a corrosion resistant substrate or component having a passivated surface. For example, the substrate may comprise metal (ferrous and non-ferrous), glass, carbon, copper, quartz, nickel-containing ferrous alloys, titanium, titanium alloys, aluminum, aluminum alloys and ceramics. The surface of the substrate has an average surface roughness RA. A silicon layer is formed over the substrate surface to passivate the surface. The silicon layer is formed from a plurality of layers of silicon and is substantially free of silicon dust. Preferably from one to ten layers of silicon may be applied.

What is claimed is:

1. A substrate having an improved surface, said substrate having a plurality of layers of silicon over the substrate, the plurality of layers of silicon including an outermost layer of silicon, the outermost layer of silicon being functionalized with an unsaturated hydrocarbon moiety which is covalently bonded thereto.

2. The substrate of claim 1, wherein the unsaturated hydrocarbon moiety comprises —CH=CH$_2$ or —C≡CH.

3. The substrate of claim 1, wherein the substrate comprises a vessel with a controllable environment, and wherein said improved surface is disposed within said controllable environment.

4. The substrate of claim 1, the substrate comprising a ferrous metal, a non-ferrous metal, glass, carbon, quartz, a nickel containing ferrous alloy, titanium, a titanium alloy, aluminum, an aluminum alloy, or a ceramic.

5. A substrate having a coating formed thereon, the coating consisting essentially of a plurality of layers of silicon formed over the substrate, the plurality of layers of silicon including an outermost layer of silicon, the outermost layer of silicon being functionalized with an unsaturated hydrocarbon moiety which is covalently bonded thereto.

6. The substrate of claim 5, wherein the unsaturated hydrocarbon moiety comprises —CH═CH$_2$ or —C≡CH.

7. A substrate having a surface and means coating the surface for imparting improved surface properties for application in corrosive, chemical, and/or vacuum environments, said means comprising a coating of a plurality of layers of hydrogenated amorphous silicon, the plurality of layers of hydrogenated amorphous silicon including an outermost layer of hydrogenated amorphous silicon, the outermost layer of hydrogenated amorphous silicon being functionalized with an unsaturated hydrocarbon moiety which is covalently bonded thereto.

8. The substrate of claim 7, wherein the unsaturated hydrocarbon moiety comprises —CH═CH$_2$ or —C≡CH.

* * * * *